(12) United States Patent
Erdogan et al.

(10) Patent No.: US 9,344,097 B2
(45) Date of Patent: May 17, 2016

(54) FAST ACQUISITION FREQUENCY DETECTOR

(71) Applicant: TEXAS INSTRUMENTS INCORPORATED, Dallas, TX (US)

(72) Inventors: Mustafa Ulvi Erdogan, Allen, TX (US); Sridhar Ramaswamy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/726,753

(22) Filed: Jun. 1, 2015

(65) Prior Publication Data

US 2015/0349785 A1 Dec. 3, 2015

Related U.S. Application Data

(60) Provisional application No. 62/006,642, filed on Jun. 2, 2014.

(51) Int. Cl.
*H04L 7/033* (2006.01)
*H03L 7/08* (2006.01)
*H03L 7/087* (2006.01)

(52) U.S. Cl.
CPC .............. *H03L 7/0807* (2013.01); *H03L 7/087* (2013.01); *H04L 7/0331* (2013.01)

(58) Field of Classification Search
USPC .......... 375/374, 375, 376, 371, 316; 345/211
See application file for complete search history.

(56) References Cited

U.S. PATENT DOCUMENTS

| 7,974,375 B2* | 7/2011 | Kim | H03L 7/087 327/235 |
|---|---|---|---|
| 2007/0286321 A1* | 12/2007 | Gupta | H03L 7/091 375/375 |
| 2013/0188762 A1* | 7/2013 | Mukherjee | H04L 7/033 375/371 |
| 2015/0043698 A1* | 2/2015 | Chang | H04L 7/0041 375/374 |
| 2015/0098527 A1* | 4/2015 | Wang | H04L 7/033 375/316 |
| 2015/0279299 A1* | 10/2015 | Liou | H04L 7/0331 345/211 |

* cited by examiner

*Primary Examiner* — Eva Puente
(74) *Attorney, Agent, or Firm* — Gregory J. Albin; Frank D. Cimino

(57) ABSTRACT

A phase-frequency detector (PFD) circuit that includes a binary phase detector and a ternary phase detector coupled to the binary phase detector. The binary phase detector is configured to, based on the PFD circuit being in a frequency acquisition state, compare a clock signal with a data signal and output up and down signals based on the comparison. The binary phase detector is also configured to be disabled based on the PFD circuit being in a frequency locked state. The ternary phase detector is configured to compare the clock signal with the data signal and output up, down, and hold signals based on the comparison.

24 Claims, 3 Drawing Sheets

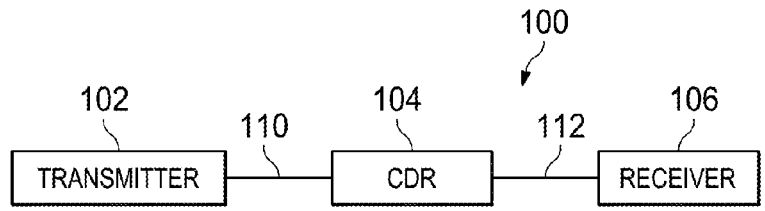
FIG. 1
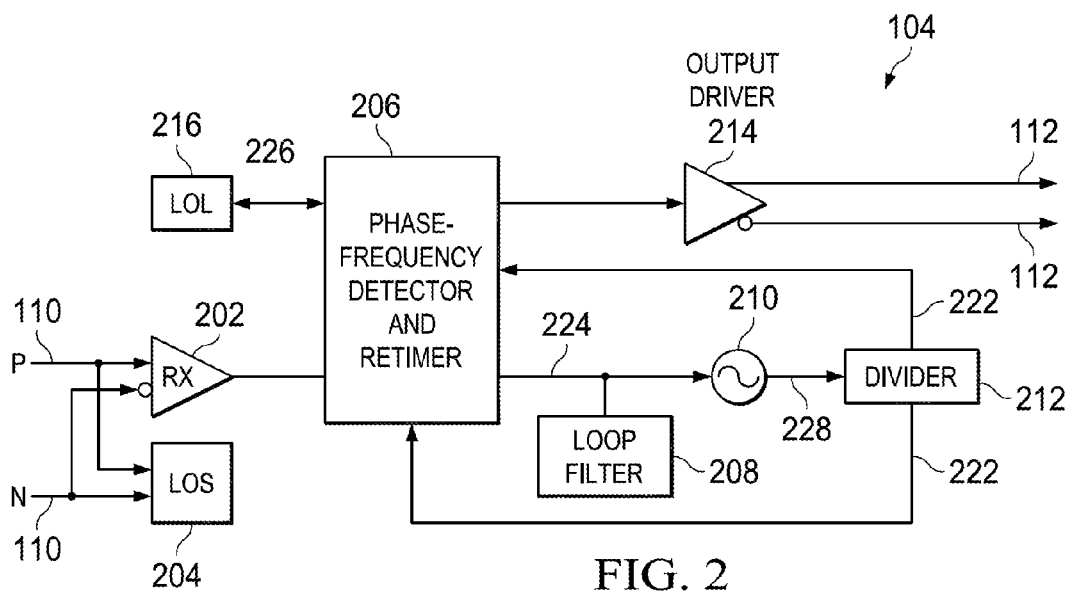
FIG. 2
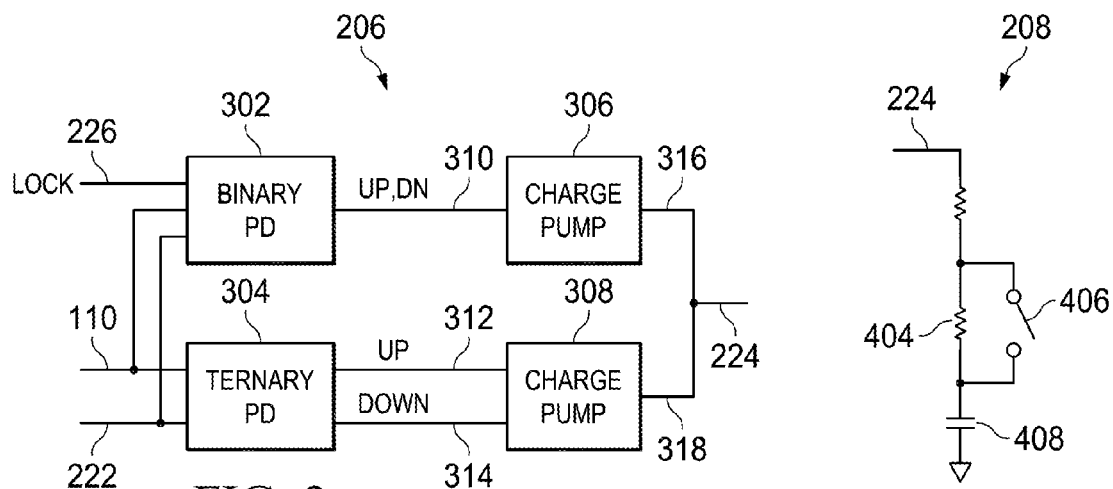
FIG. 3
FIG. 4

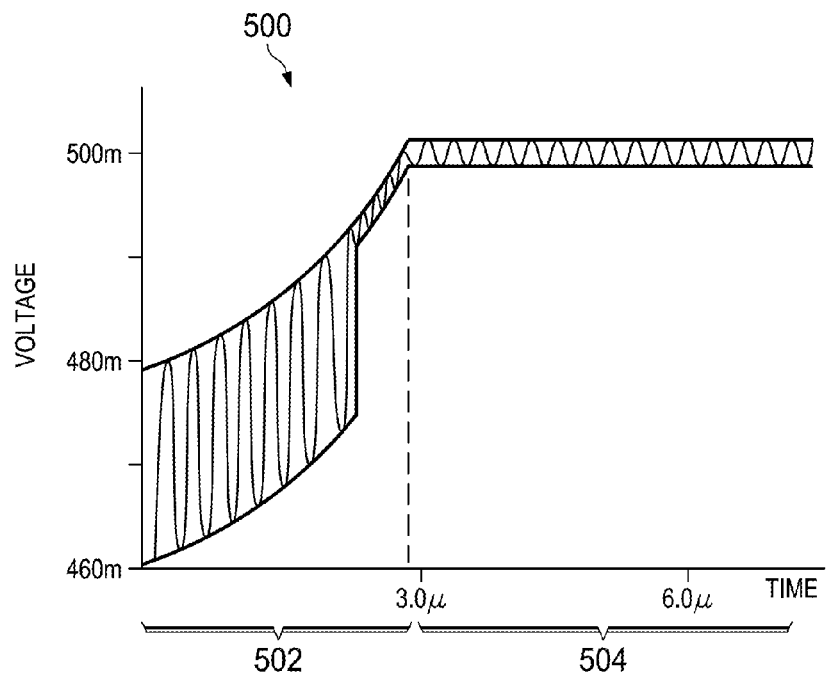
FIG. 5
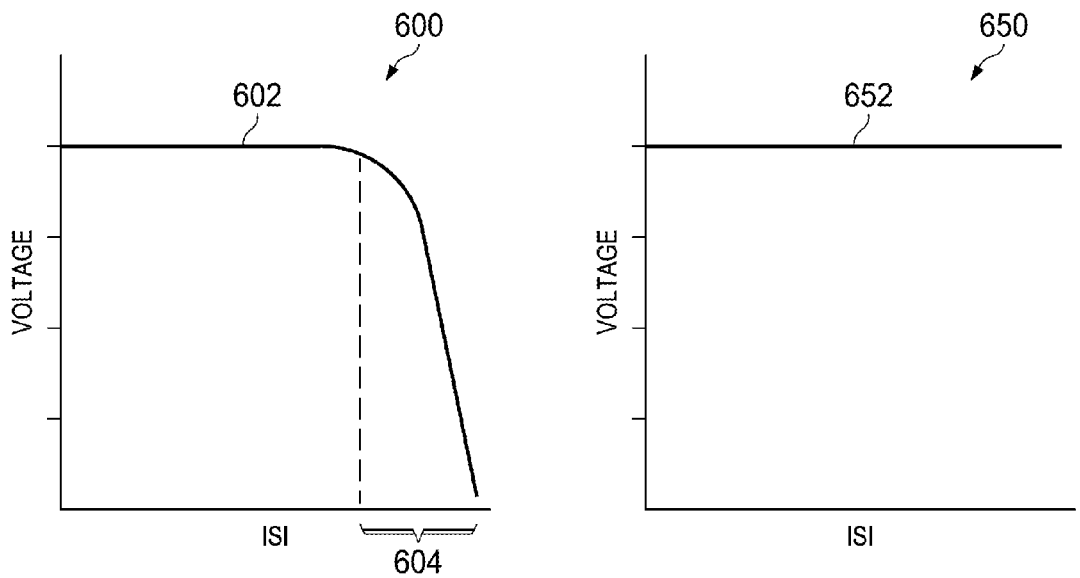
FIG. 6A
FIG. 6B

FAST ACQUISITION FREQUENCY DETECTOR

CROSS-REFERENCE TO RELATED APPLICATIONS

The present application claims priority to U.S. Provisional Patent Application No. 62/006,642, filed Jun. 2, 2014, titled "Fast Acquisition Frequency Detector For Clock And Data Recovery Circuits," which is hereby incorporated herein by reference in its entirety.

BACKGROUND

In many communication systems, data is streamed from one device to another without an accompanying clock signal. During the transmission, the signals carrying the data streams may become jittery and difficult to decipher and process by the receiving device. Therefore, many systems utilize clock and data recovery circuits (CDR) to retime the incoming signals carrying the data streams and transmit the retimed signals to the receiving device. This requires the CDR to generate a clock that locks to the frequency of the streamed data. Thus, the CDR must detect the frequency of the incoming signals.

SUMMARY

The problems noted above are solved in large part by systems and methods for detecting frequency of an input signal in a communication system. In some embodiments, a phase-frequency detector circuit (PFD) includes a binary phase detector and a ternary phase detector coupled to the binary phase detector. The binary phase detector is configured to, based on the PFD circuit being in a frequency acquisition state, compare a clock signal with a data signal and output UP and DOWN signals based on the comparison. The binary phase detector is also configured to be disabled based on the PFD circuit being in a frequency locked state. The ternary phase detector is configured to compare the clock signal with the data signal and output UP, DOWN, and HOLD signals based on the comparison.

Another illustrative embodiment is a clock and data recovery circuit comprising a phase-frequency detector circuit (PFD), a loop filter coupled to the PFD circuit, and a voltage-controlled oscillator (VCO) coupled to the loop filter. The PFD circuit includes a binary phase detector and a ternary phase detector and is configured to lock a clock signal to a data signal. The binary phase detector is configured to compare the clock signal with the data signal and output up and down signals based on the comparison and based on the PFD circuit being in a frequency acquisition state. The binary phase detector is further configured to be disabled based on the PFD circuit being in a frequency locked state.

Yet another illustrative embodiment is a communication system comprising a transmitter, a clock and data recovery circuit coupled to the transmitter, and a receiver coupled to the clock and data recovery circuit. The clock and data recovery circuit is configured to receive a data signal from the transmitter and generate a clock signal from the data signal. The receiver is configured to receive an output signal from the clock and data recovery circuit. The clock and data recovery circuit includes a binary phase detector and a ternary phase detector. The binary phase detector is configured to output up and down signals based on the clock and data recovery circuit being in a frequency acquisition state and to be disabled on the clock and data recovery circuit being in a frequency locked state.

Another illustrative embodiment is a method for detecting a frequency of an input signal. The method may comprise receiving the input signal and based on a phase-frequency detector circuit (PFD) being in a frequency acquisition state, comparing, by a binary phase detector, a clock signal with the input signal and outputting, by the binary phase detector, an error signal based on the comparison. The method also comprises comparing, by a ternary phase detector, the clock signal with the input signal and outputting, by the ternary phase detector an error signal and a hold signal based on the comparison. The method also comprises based on the PFD circuit transitioning from the frequency acquisition state to a frequency locked state, disabling the binary phase detector.

BRIEF DESCRIPTION OF THE DRAWINGS

For a detailed description of various examples, reference will now be made to the accompanying drawings in which:

FIG. 1 shows a block diagram of a communication system in accordance with various embodiments;

FIG. 2 shows a circuit diagram of a clock and data recovery circuit in accordance with various embodiments;

FIG. 3 shows a circuit diagram of a phase-frequency detector circuit in accordance with various embodiments;

FIG. 4 shows a circuit diagram of a loop filter in accordance with various embodiments;

FIG. 5 shows an example voltage versus time curve for locking a clock signal to an input signal in a communication system in accordance with various embodiments;

FIG. 6A shows an example voltage versus time curve with a loss of frequency lock in a communication system utilizing a conventional clock and data recovery circuit in accordance with various embodiments;

FIG. 6B shows an example voltage versus time curve maintaining a frequency lock in a communication system in accordance with various embodiments.

NOTATION AND NOMENCLATURE

Figure 7:
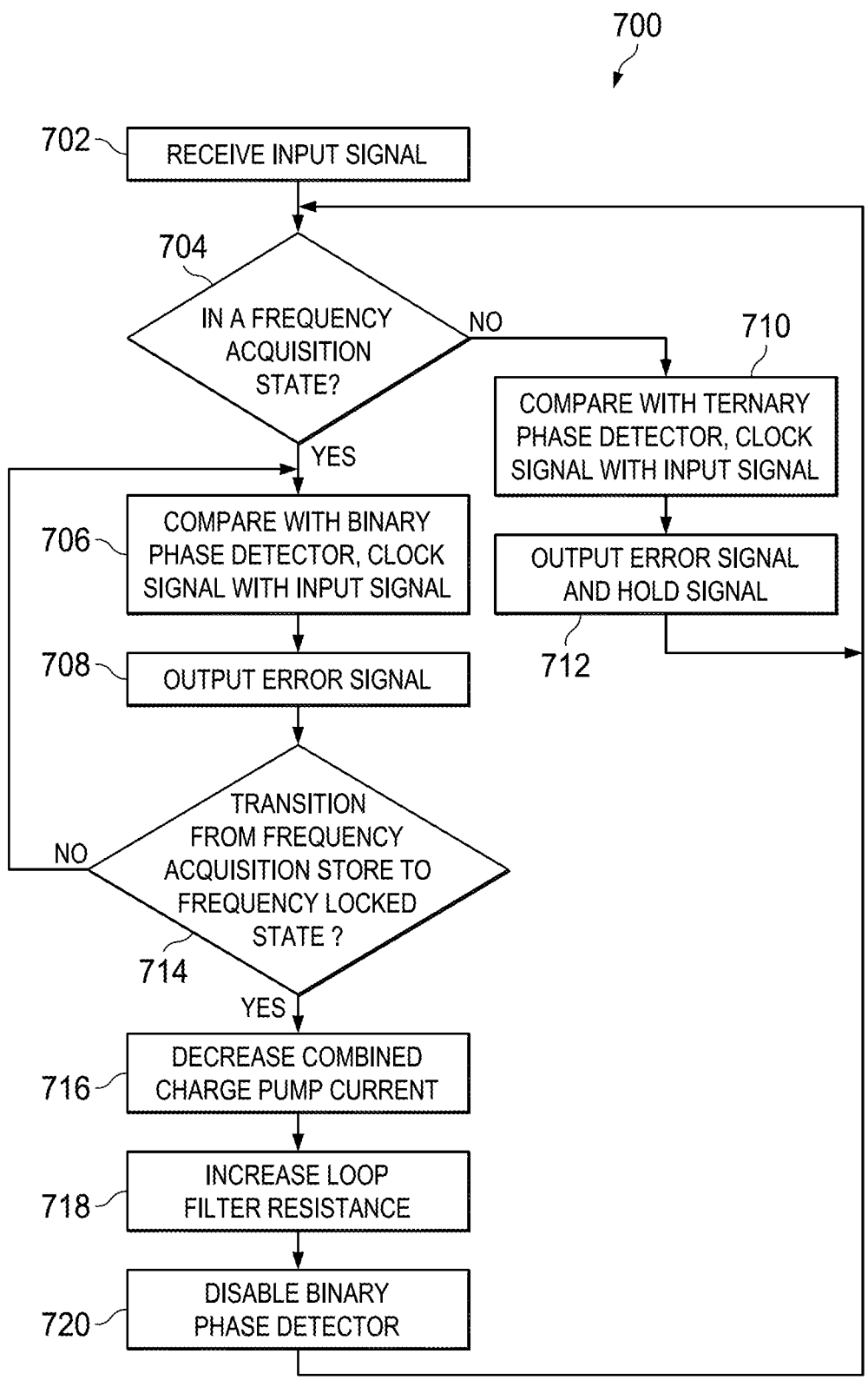
FIG. 7 shows a flow diagram of a method for detecting a frequency of an input signal by a phase-frequency detector circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Communication systems may be utilized to transfer data from a transmitting device to a receiving device for further processing. One type of communication system is a fiber optic system. A fiber optic system transmits data through the transmission of pulses of light through an optical fiber. Due to the optics in the optical fiber and noise from semiconductor devices, the data signals may incur jitter (i.e., instantaneous deviation from the original periodicity of the data signal sent by the transmitter which may be observed in the signal amplitude, phase, or frequency of the signal). This jitter may decrease, or in some cases prevent entirely, the receiving device's capability to process the data signal. Clock and data recovery circuits (CDRs) may be utilized in these communication systems to retime the data signal, so that the receiving device may receive a correctly timed, jitter-free signal. Because the data signal is transmitted without an accompanying clock, the CDR detects the frequency and/or phase of the data signal in order to create a clock that is locked to the frequency and phase of the data signal. This allows for a retimed signal to be provided to the receiving device.

The conventional CDR may utilize a rotational frequency detector (sometimes termed a "Pottbacker" detector) for its frequency detection. However, the rotational frequency detector may lock the clock to an incorrect frequency. Additionally, conventional CDRs may utilize external components which increase cost, power, and space within the system or may take too long to create the lock between the clock and the input data signal. The embodiments described herein pertain to a CDR that is able to quickly and accurately lock the clock to the input data signal while reducing space, power, and costly components.

FIG. 1 shows a block diagram of a communication system 100 in accordance with various embodiments. Communication system 100 may include transmitter 102, clock and data recovery circuit (CDR) 104, and receiver 106. Communication system 100 may be any type of communication system, including a fiber optic communication system. Transmitter 102 is any device that may transmit signals, including signals carrying data. The signals transmitted by transmitter 102 may be generated by transmitter 102 or they may be received by transmitter 102 from another device and retransmitted to the receiver 106. In an embodiment, the signals transmitted by transmitter 102 are fiber optic signals and may include telephone signals, internet communication, and/or cable television signals. In alternative embodiments, the signals transmitted by transmitter 102 may include any other type of electrical or optical signal. In some embodiments, transmitter 102 may include a light-emitting diode (LED) or a laser diode.

CDR 104 is coupled to transmitter 102 through a communication link and is configured to receive the signal transmitted by transmitter 102, shown as input signal 110. The communication link may be a fiber optic or electrically conductive cable or any other type of communication link that allows communication of an electrical or optical signal from transmitter 102 to CDR 104, including a wireless link. While input signal 110 may be any waveform, in some embodiments, it is a square wave and may be an optical signal. CDR 104 may be an electrical circuit configured to generate a clock signal from input signal 110. In some embodiments, input signal 110 does not contain an accompanying clock signal. Therefore, CDR 104 generates a clock signal from an approximate frequency reference and phase aligns to the transitions in the input signal 110.

CDR 104 may generate an output signal 112 that has a phase and frequency related to the phase and frequency of the input signal 110. Thus, the data within input signal 110 may be transmitted within the output signal 112 of CDR 104. In other words, CDR 104 is configured to retime the input signal 110 and output a signal 112 with a related phase and frequency that regenerates the same data. This may eliminate jitter that input signal 110 may have developed while being carried in the communication link.

Receiver 106 is coupled to CDR 104 through a communication link that carries output signal 112. Receiver 106 is configured to receive output signal 112 from CDR 104. The communication link may be a fiber optic or electrically conductive cable or any other type of communication link that allows communication of output signal 112 to receiver 106, including a wireless link. While output signal 112 may be any waveform, in some embodiments, it is a square wave and may be an optical signal. Because output signal 112 may be an optical signal, in an embodiment, receiver 106 is configured to receive fiber optic signals and may include a photodetector. Receiver 106 then may process the data contained in the output signal 112 for further use. In some embodiments, the CDR 104 is separate from, but coupled to, the receiver 106. In other embodiments, the CDR 104 is a circuit that is included as part of the receiver 106.

FIG. 2 shows a circuit diagram of CDR 104 in accordance with various embodiments. CDR 104 may include a receiver 202, a loss of signal circuit (LOS) 204, a phase-frequency detector circuit (PFD) 206, a loop filter 208, a voltage-controlled oscillator (VCO) 210, a divider 212, an output driver 214, and a loss of lock circuit (LOL) 216. In some embodiments PFD 206 may be termed phase-frequency detector and retime circuit 206. Receiver 202 is configured to receive input signal 110. While receiver 202 is depicted as a p-n photodiode in FIG. 2, receiver 202 may be any type of receiver and in some embodiments, any photodetector including a p-i-n photodiode, an avalanche photodiode, or a metal-semiconductor-metal photodetector that is capable of receiving optical signals. LOS 204 is a circuit that is configured to determine whether input signal 110 is present for signal processing by CDR 104.

PFD 206 is configured to determine the frequency of the input signal 110 (i.e., the frequency of the data stream received by receiver 202). PFD 206 may also be configured to determine the phase in which to align the clock signal 222 of CDR 104. In other words, because the input signal 110 may be in the form of a square wave, the PFD 206 is configured to determine where to align the edges of the clock signal 222, which also may be in the form of a square wave, with respect to the edges of input signal 110.

PFD 206 determines the difference in frequency and/or phase between input signal 110 and clock signal 222. If the signals are square waves, PFD 206 may determine this difference by comparing the rising edge of the input signal 110 square wave to the rising edge of the clock signal 222 square wave. PFD 206 then may produce error signals based on the amount of frequency and/or phase difference it has detected between input signal 110 and clock signal 222. The PFD 206 then may translate the error signals into proportional positive and negative charge packets in the form of combined charge pump output signal 224 which are then fed into loop filter 208. This may cause the voltage at the output of loop filter 208 to increase or decrease based on the amount of positive or negative charge that enters loop filter 208.

Loop filter 208 may be a low pass filter which may be used to convert combined charge pump output signal 224, which is in the form of current, to voltage and also create loop stability. Loop filter 208 may also be used to limit reference frequency energy (i.e., ripple) which may appear at the PFD 206 combined charge pump output signal 224. The filtered combined charge pump output signal 224 then may be provided to VCO 210 for tuning.

VCO 210 may be an electronic oscillator configured to control oscillation frequency by a voltage input. Thus, the frequency of oscillation created is varied by the applied voltage. Based on the voltages VCO 210 receives from loop filter 208, VCO 210 tunes, or changes, the frequency and/or phase of its output to better track, once it is divided, the input signal 110 and outputs a signal identified as VCO signal 228. Like input signal 110 and clock signal 222, VCO signal 228 may take any waveform, including a square wave.

Because, in some embodiments, VCO 210 produces VCO signal 228 at a higher frequency than input signal 110, divider 212 is used to divide down the VCO signal 228 and outputs clock signal 222. In some embodiments, divider 212 divides VCO signal 228 by 2 to create two distinct loops carrying clock signal 222 that are fed into PFD 206. In alternative embodiments, divider 212 divides VCO signal 228 by 4 to create 2 distinct loops carrying 2 different phases of clock signal 222 in each loop that are fed into PFD 206.

LOL 216 is configured to determine whether the frequency of clock signal 222 is locked to the frequency of input signal 110 and/or if a locked clock signal 222 experiences a loss of lock with input signal 110. LOL 216 is coupled to PFD 206 and may send a lock signal 226 to PFD 206 that indicates that the clock signal 222 is locked to input signal 110 and/or that the clock signal 222 has lost lock or is not locked to input signal 110.

PFD 206 also provides a retimed, based on the locked clock signal 222, input signal 110 to output driver 214. Output driver 214 is any type of output driver that may transmit the retimed input signal to receiver 106 for further processing as output signal 112. In some embodiments, output driver 214 is an optical output driver such as a electroabsorptive modulated laser (EML).

FIG. 3 shows a circuit diagram of PFD 206 in accordance with various embodiments. PFD 206 may include a binary phase detector 302 connected to charge pump 306 and a ternary phase detector 304 connected to charge pump 308. In an embodiment, during a frequency acquisition state (i.e., while the clock signal 222 is not locked to the input signal 110), input signal 110 and clock signal 222 are input into binary phase detector 302. Binary phase detector 302 compares the rising edge of the input signal 110 square wave to the rising edge of the clock signal 222 square wave and generates error signal 310 based on the comparison. Error signal 310 may be designated as an UP or DOWN signal or pulse.

An UP signal created by binary phase detector 302 may be an indication that the frequency of input signal 110 is higher than the frequency of clock signal 222. A DOWN signal created by binary phase detector 302 may be an indication that the frequency of input signal 110 is lower than the frequency of clock signal 222. Thus, based on the PFD 206 being in a frequency acquisition state, binary phase detector 302 may output an UP and DOWN signal based on the comparison.

Charge pump 306 receives error signal 310 from binary phase detector 302 and translates the error signal 310 into proportional positive and negative charge packets which is output as a charge pump output signal 316. If charge pump 306 receives an UP signal, this may indicate that the input signal 110 frequency is higher than the clock signal 222 frequency, and a positive charge may be created to tune VCO 210 to produce a higher frequency VCO signal 228. If charge pump 306 receives a DOWN signal, this may indicate that the input signal 110 frequency is lower than the clock signal 222 frequency, and a negative charge may be created to tune VCO 210 to produce a lower frequency VCO signal 228.

However, in an embodiment, if lock signal 226 indicates that the PFD 206 is in a frequency locked state (i.e., while the clock signal 222 is locked to the input signal 110), the binary phase detector is disabled. Therefore, during a frequency locked state, the binary phase detector does not operate.

Ternary phase detector 304 receives input signal 110 and clock signal 222 as input. Ternary phase detector 304 compares the rising edge of the input signal 110 square wave to the rising edge of the clock signal 222 square wave and generates error signals 312 and 314 based on the comparison. Additionally, ternary phase detector 304 may generate a HOLD signal. A HOLD signal is an indication that ternary phase detector 304 cannot make a determination as to whether the clock signal 222 is leading or lagging the input signal 110. In this case, ternary phase detector 304 may wait to output either of error signals 312 and/or 314 until after the requisite data transition allows for a determination of whether clock signal 222 has a higher or lower frequency than input signal 110.

Because ternary phase detector 304 may delay in outputting error signals 312 and/or 314 until after it can make a determination of whether clock signal 222 has a higher or lower frequency than input signal 110, it outputs a more accurate signal than binary phase detector 302 which does not delay in outputting error signal 310 even if a determination of whether clock signal 222 has a higher or lower frequency than input signal 110 is difficult to make and thus, may be inaccurate. However, due to the delay possible in ternary phase detector 304 outputting error signals 312 and/or 314, it may produce its error signals 312 and/or 314 slower than binary phase detector 302. Consequently, the binary phase detector 302 is configured to have a larger gain, enabling frequency detection. Furthermore, this gain is constant (i.e., not influenced by data transition density) which is unlike the gain of ternary phase detector 304.

Error signal 312 may be designated as an UP signal or pulse while error signal 314 may be designated as a DOWN signal or pulse. An UP signal created by ternary phase detector 304 may be an indication that the frequency of input signal 110 is higher than the frequency of clock signal 222. A DOWN signal created by ternary phase detector 304 may be an indication that the frequency of input signal 110 is lower than the frequency of clock signal 222. Thus, ternary phase detector 304 may output an UP, DOWN, and HOLD signal based on the comparison.

Charge pump 308 receives error signals 312 and/or 314 from ternary phase detector 304 and translates the error signals 312 and/or 314 into proportional positive and negative charge packets which is output as a charge pump output signal 318. If charge pump 308 receives an UP signal, this may indicate that the input signal 110 frequency is higher than the clock signal 222 frequency, and a positive charge may be created to tune VCO 210 to produce a higher frequency VCO signal 228. If charge pump 308 receives a DOWN signal, this may indicate that the input signal 110 frequency is lower than the clock signal 222 frequency, and a negative charge may be created to tune VCO 210 to produce a lower frequency VCO signal 228.

In an embodiment, charge pump 306 is configured, while the frequency detection circuit 206 is in a frequency acquisition state, to produce charge pump output signal 316 at a higher current than charge pump output signal 318 is produced by charge pump 308. Charge pump output signal 316 and charge pump output signal 318 then may be combined to form combined charge pump output signal 224 that is received by loop filter 208. Because the current in the charge pump output signal 316 is higher than the current in the charge pump output signal 318 while in the frequency acquisition state, in effect, the binary phase detector 302 controls the behavior of VCO 210 because the combined charge pump output signal 224 current is higher. However, once the PFD 206 enters into the frequency locked state and binary phase detector 302 is disabled, only charge pump output signal 318 makes up combined charge pump output signal 224. Thus, during the frequency locked state, the ternary phase detector 304 controls the behavior of VCO 210.

Because the binary phase detector 302 may control the behavior of VCO 210 while in the frequency acquisition state, coarse adjustments may be made to the frequency of clock signal 222. While the adjustments may be coarse, the adjustments will be faster than if the ternary phase detector 304 controlled the behavior of VCO 210. This leads to a faster lock acquisition. However, once the clock signal 222 is locked to input signal 110, the binary phase detector 302 may be disabled, and the ternary phase detector 304 may cause fine, accurate adjustments to the clock frequency 222 when a large gain is not as critical.

FIG. 4 shows a circuit diagram of loop filter 208 in accordance with various embodiments. Loop filter 208 may include a resistor, resistor 404 in parallel with switch 406, and capacitor 408. In some embodiments, loop filter 208 provides a resistance to combined charge pump output signal 224. The lower the resistance provided by the loop filter 208, the faster clock signal 222 locks to input signal 110. Additionally, a lower resistance in loop filter 208 allows for an increased lock in range because loop filter 208 allows more signals through to VCO 210. Thus, in some embodiments, switch 406 is closed while the frequency detection circuit 206 is in the frequency locked state. However, when the frequency detection circuit 206 is in the frequency acquisition state, switch 406, in an embodiment, is open raising the resistance of loop filter 208. In some embodiments, the value of the loop filter 208 resistance while in a frequency acquisition state is approximately $1/10^{th}$ the value of the loop filter 208 resistance while in the frequency locked state. Switch 406 may be controlled by lock signal 226 and/or an externally controlled signal.

FIG. 5 shows an example voltage versus time curve 500 for locking clock signal 222 to input signal 110 in communication system 100 in accordance with various embodiments. In this example, during the time frame labeled 502, PFD 206 is in the frequency acquisition state (i.e., the clock signal 222 is not locked to the input signal 110). In this example, the loop filtered combined charge pump output signal 224 voltage that controls VCO 210 (i.e., the VCO 210 control voltage) that indicates a locked clock signal 222 is 500 mV. In alternative embodiments, the VCO 210 control voltage may be any voltage. Prior to lock, during time frame 502 (i.e., the frequency acquisition state), binary phase detector 302 is configured to compare the rising edge of the clock signal 222 square wave with the rising edge of input signal 110 square wave and based on the comparison, output an UP and DOWN signal. These UP and DOWN signals cause charge pump 306 to output proportional positive and negative charge packets that drive VCO 210. Additionally, during time frame 502, the current of combined charge pump output signal 224 may be greater than the current of combined charge pump output signal 224 when the clock signal 222 is locked to input signal 110. Furthermore, during time frame 502, the resistance of loop filter 208 may be less than the resistance of loop filter 208 when the clock signal 222 is locked to input signal 110. In this example, the clock signal 222 takes a little under 3 μs to achieve lock; however, in alternative embodiments, lock may be achieved in any amount of time.

In this example, during the time frame labeled 504, PFD 206 is in the frequency locked state (i.e., the clock signal 222 is locked to the input signal 110). During time frame 504 (i.e., the frequency locked state), binary phase detector 302 may be disabled. Therefore, ternary phase detector 304 drives VCO 210. During time frame 504, ternary phase detector 304 is configured to compare the edges of the clock signal 222 square wave with the edges of input signal 110 square wave and based on the comparison, output an UP, DOWN, and HOLD signal. The UP and DOWN signal cause charge pump 308 to output proportional positive and negative charge packets that drive VCO 210. The HOLD signal causes the ternary phase detector 304 to wait until it can make an accurate determination of whether to output an UP or DOWN signal. Additionally, during time frame 504, the current of combined charge pump output signal 224 may be less than the current of combined charge pump output signal 224 when the clock signal 222 is not locked to input signal 110. Furthermore, during time frame 504, the resistance of loop filter 208 may be greater than the resistance of loop filter 208 when the clock signal 222 is not locked to input signal 110.

FIG. 6A shows an example voltage versus time curve 600 with a loss of frequency lock in a communication system utilizing a conventional CDR in accordance with various embodiments. Because conventional CDRs may utilize a rotational frequency detector, the detector may false lock in the presence of inter symbol interference (ISI). In other words, a conventional CDR may lock its clock signal to an frequency that is not the frequency of its input signal due to the inter symbol interference (ISI). The VCO control voltage of this example conventional CDR is shown as 602. During time period 604, the VCO control voltage begins to decrease and creates a false lock.

FIG. 6B shows an example voltage versus time curve 650 in communication system 100 utilizing CDR 104 in accordance with various embodiments. By utilizing the binary phase detector 302 and ternary phase detector 304 to achieve and maintain lock of clock signal 222 with input signal 110, CDR 104 is able to maintain lock even in the presence of a large ISI. Thus, the VCO control voltage (i.e., the filtered combined charge pump output signal 224) maintains lock as shown by 652.

FIG. 7 shows a flow diagram of a method 700 for detecting a frequency of input signal 110 by PFD 206 in accordance with various embodiments. Though depicted sequentially as a matter of convenience, at least some of the actions shown in method 700 can be performed in a different order and/or performed in parallel. Additionally, some embodiments may perform only some of the actions shown or may perform additional actions. In some embodiments, at least some of the operations of the method 700, as well as other operations described herein, can be performed by CDR 104 implemented by a processor executing instructions stored in a non-transitory computer readable storage medium or a state machine.

The method 700 begins in block 702 with receiving, by CDR 104 input signal 110. In block 704, the method 700 continues, with determining, in some embodiments by LOL 216, whether PFD 206 is in a frequency acquisition state (i.e., whether clock signal 222 is locked to input signal 110).

If the determination in block 704 is that the PFD 206 is in a frequency acquisition state, then, in block 706, the method 700 continues with comparing by binary phase detector 302, clock signal 222 with input signal 110. In an embodiment, binary phase detector 302 compares the rising edge of the clock signal 222 square wave with the rising edge of the input signal 110 square wave. The method 700 continues in block 708 with outputting, by binary phase detector 302, error signal 310 based on the comparison. Error signal 310 may be designated as an UP or DOWN signal or pulse. Additionally, the method 700, while not shown in FIG. 7, in an embodiment may continue with comparing by ternary phase detector 304, clock signal 222 with input signal 110. In an embodiment, ternary phase detector 304 compares the rising edge of the clock signal 222 square wave with the rising edge of the input signal 110 square wave. The method 700 may also continue with outputting, by ternary phase detector 304, error signals 312 and a HOLD signal based on the comparison. In alternative embodiments, ternary phase detector 304 may be disabled while PFD 206 is in the frequency acquisition state.

In block 714, the method 700 continues with determining, in an embodiment by LOL 216, whether PFD 206 has transitioned from the frequency acquisition state to the frequency locked state. If the determination in block 714 is that a transition to the frequency locked state has occurred, then method 700 continues in block 716 with decreasing the current of combined charge pump output signal 224. In block 718, the method 700 continues with increasing the resistance of loop filter 208. In block 720, the method 700 continues with disabling binary phase detector 302. Then, method 700 then may continue in block 704 with determining, in some embodiments by LOL 216, whether PFD 206 is in a frequency acquisition state. However, if the determination in block 714 is that a transition has not occurred, then the method 700 continues in block 706 with comparing, by binary phase detector 302, clock signal 222 with input signal 110.

If the determination in block 704 is that the PFD 206 is not in a frequency acquisition state, then, in block 710 the method 700 continues at block 710 with comparing by ternary phase detector 304, clock signal 222 with input signal 110. In an embodiment, ternary phase detector 304 compares the edges of the clock signal 222 square wave with the edges of the input signal 110 square wave. The method 700 continues in block 712 with outputting, by ternary phase detector 304, error signals 312 and a HOLD signal based on the comparison. The method 700 then may continue in block 704 with determining, in some embodiments by LOL 216, whether PFD 206 is in a frequency acquisition state.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phase-frequency detector (PFD) circuit, comprising:
   a binary phase detector configured to, based on the PFD circuit being in a frequency acquisition state, compare a clock signal with a data signal and output up and down signals based on the comparison; and
   a ternary phase detector coupled to the binary phase detector, the ternary phase detector configured to compare the clock signal with the data signal and output up, down, and hold signals based on the comparison,
   wherein the binary phase detector is further configured to be disabled based on the PFD circuit being in a frequency locked state.

2. The PFD circuit of claim 1, further comprising:
   a first charge pump connected to the binary phase detector, the first charge pump configured to output a first charge pump output signal at a first current; and
   a second charge pump connected to the ternary phase detector, the second charge pump configured to output a second charge pump output signal at a second current.

3. The PFD circuit of claim 2, wherein the first charge pump output signal is configured to combine with the second charge pump output signal to form a combined charge pump output signal at a third current.

4. The PFD circuit of claim 3, wherein the third current is configured to be at a higher value during the frequency acquisition state than during the frequency locked state.

5. The PFD circuit of claim 1, wherein the binary phase detector is configured to receive a lock signal from a loss of lock detector based on the PFD transitioning from the frequency acquisition state to the frequency locked state.

6. The PFD circuit of claim 1, wherein the binary phase detector is configured to receive a lock signal from a loss of lock detector based on the PFD transitioning from the frequency locked state to the frequency acquisition state.

7. The PFD circuit of claim 1, wherein the data signal is a fiber optic signal.

8. A clock and data recovery circuit, comprising:
   a phase-frequency detector (PFD) circuit including a binary phase detector that is configured to compare a clock signal with a data signal and output up and down signals based on the comparison and based on the PFD circuit being in a frequency acquisition state and a ternary phase detector, the PFD circuit configured to lock the clock signal to the data signal;
   a loop filter coupled to the PFD circuit; and
   a voltage-controlled oscillator (VCO) coupled to the loop filter,
   wherein the binary phase detector is further configured to be disabled based on the PFD circuit being in a frequency locked state.

9. The clock and data recovery circuit of claim 8, wherein the ternary phase detector is configured to compare the clock signal with the data signal and output up, down, and hold signals based on the comparison during the frequency acquisition state and the frequency locked state.

10. The clock and data recovery circuit of claim 8, wherein the PFD circuit further includes a first charge pump connected to the binary phase detector and a second charge pump connected to the ternary phase detector, the first charge pump is configured to output a first charge pump output signal that is configured to combine with an output signal of the second charge pump to produce a combined charge pump output signal.

11. The clock and data recovery circuit of claim 10, wherein the loop filter is configured to provide a resistance to the combined charge pump output signal, the resistance configured to be a lower value during the frequency acquisition state than during the frequency locked state.

12. The clock and data recovery circuit of claim 10, wherein the combined charge pump output signal is at a current that is configured to be a higher value during the frequency acquisition state than during the frequency locked state.

13. The clock and data recovery circuit of claim 8, wherein the loop filter includes a first resistor in parallel with a switch and a second resistor in series with the first resistor and the switch.

14. The clock and data recovery circuit of claim 13, wherein the switch is configured to be closed during the frequency acquisition state.

15. The clock and data recovery circuit of claim 13, wherein the switch is configured to be open during the frequency locked state.

16. The clock and data recovery circuit of claim 8, further comprising a loss of lock detector connected to the PFD circuit, the loss of lock detector configured to determine if the data signal is locked to the clock signal.

17. The clock and data recovery circuit of claim 16, wherein the loss of lock detector is further configured to generate a lock signal to be received by the binary phase detector based on a determination that the data signal is locked to the clock signal.

18. The clock and data recovery circuit of claim 17, wherein, based on the binary phase detector receiving the lock signal, the PFD circuit is configured to transition from the frequency acquisition state to the frequency locked state.

19. A communication system, comprising:
a transmitter;
a clock and data recovery circuit coupled to the transmitter, the clock and data recovery circuit configured to receive a data signal from the transmitter and generate a clock signal from the data signal; and
a receiver coupled to the clock and data recovery circuit, the receiver configured to receive an output signal from the clock and data recovery circuit,
wherein the clock and data recovery circuit includes a binary phase detector and a ternary phase detector, the binary phase detector configured to output up and down signals based on the clock and data recovery circuit being in a frequency acquisition state and to be disabled based on the clock and data recovery circuit being in a frequency locked state.

20. The communication system of claim 19, wherein the clock and data recovery circuit further includes a first charge pump configured to receive an output signal from the binary phase detector and generate a first charge pump signal and a second charge pump configured to receive an output signal from the ternary phase detector and generate a second charge pump signal, and
wherein the first and second charge pump signals are combined to produce a combined charge pump output signal at a current level, the current level being at a higher value during the frequency acquisition state than during the frequency locked state.

21. The communication system of claim 20, wherein the clock and data recovery circuit further includes a loop filter configured to provide a resistance to the combined charge pump output signal, the resistance configured to be a lower value during the frequency acquisition state than during the frequency locked state.

22. A method for detecting a frequency of an input signal, comprising:
receiving the input signal;
based on a phase-frequency detector (PFD) circuit being in a frequency acquisition state, comparing, by a binary phase detector, a clock signal with the input signal and outputting, by the binary phase detector, an error signal based on the comparison;
comparing, by a ternary phase detector, the clock signal with the input signal;
outputting, by the ternary phase detector an error signal and a hold signal based on the comparison performed by the ternary phase detector; and
based on the PFD circuit transitioning from the frequency acquisition state to a frequency locked state, disabling the binary phase detector.

23. The method for detecting a frequency of an input signal of claim 22, further comprising, based on the PFD circuit transitioning from the frequency acquisition state to the frequency locked state, decreasing a current of a combined charge pump signal.

24. The method for detecting a frequency of an input signal of claim 22, further comprising, based on the frequency detector circuit transitioning from the frequency acquisition state to the frequency locked state, increasing a resistance of a loop filter.

* * * * *